(12) United States Patent
Yu et al.

(10) Patent No.: US 9,869,939 B2
(45) Date of Patent: *Jan. 16, 2018

(54) LITHOGRAPHY PROCESS

(71) Applicant: Taiwan Semiconductor Manufacturing Company, Ltd., Hsin-Chu (TW)

(72) Inventors: Shinn-Sheng Yu, Hsinchu (TW); Anthony Yen, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 110 days.

This patent is subject to a terminal disclaimer.

(21) Appl. No.: 14/733,719

(22) Filed: Jun. 8, 2015

(65) Prior Publication Data

US 2015/0268565 A1 Sep. 24, 2015

Related U.S. Application Data

(63) Continuation of application No. 13/832,945, filed on Mar. 15, 2013, now Pat. No. 9,052,595.

(51) Int. Cl.
| | |
|---|---|
| *G06F 17/50* | (2006.01) |
| *G03F 7/20* | (2006.01) |
| *G03F 1/70* | (2012.01) |
| *G03F 1/42* | (2012.01) |

(52) U.S. Cl.
CPC ............ *G03F 7/70633* (2013.01); *G03F 1/42* (2013.01); *G03F 1/70* (2013.01); *G03F 7/20* (2013.01); *G06F 17/5068* (2013.01)

(58) Field of Classification Search
CPC .......... G03F 7/002; G03F 7/70; G03F 7/2051; G03F 7/2063; G03F 7/70433; G03F 1/42; G03F 7/70633
USPC ..................................................... 716/50–56
See application file for complete search history.

(56) References Cited

U.S. PATENT DOCUMENTS

| | | | |
|---|---|---|---|
| 7,065,737 B2 | 6/2006 | Phan et al. | |
| 7,423,725 B2 | 9/2008 | Zaal et al. | |
| 7,667,842 B2 | 2/2010 | Schulz | |
| 7,808,613 B2 | 10/2010 | Lof | |
| 7,842,442 B2 | 11/2010 | Seltmann et al. | |
| 2005/0118514 A1* | 6/2005 | Tsai ................... | G03F 7/70633 430/5 |
| 2011/0051150 A1* | 3/2011 | Choi ................... | G03F 7/70633 356/620 |

(Continued)

*Primary Examiner* — Paul Dinh
(74) *Attorney, Agent, or Firm* — Haynes and Boone, LLP

(57) ABSTRACT

A method for being used in a lithography process is provided. The method includes receiving a first mask, a second mask and a substrate with a set of baseline registration marks. A first set of registration marks is formed on the substrate using the first mask and a first exposure tool, and a first set of overlay errors is determined. The first set of registration marks is removed and a second set of registration marks is formed on the substrate using the second mask and a second exposure tool. A second set of overlay errors is determined. A set of tool-induced overlay errors is generated from the first and second sets of overlay errors and used in fabricating a third mask. The third mask can then be used in the lithography process to accommodate the overlay errors caused by different exposure tools, different masks, and different mask writers.

20 Claims, 5 Drawing Sheets

(56) References Cited

U.S. PATENT DOCUMENTS

| | | |
|---|---|---|
| 2012/0154773 A1 | 6/2012 | Beyer |
| 2012/0244459 A1 | 9/2012 | Chou et al. |
| 2013/0054186 A1 | 2/2013 | Den Boef |
| 2013/0335718 A1 | 12/2013 | Fang et al. |
| 2014/0036243 A1 | 2/2014 | Beyer et al. |

\* cited by examiner ered. The IC design layout 122 includes various geometrical patterns designed for an IC product...

LITHOGRAPHY PROCESS

PRIORITY DATA

The present application is a continuation patent application of U.S. patent application Ser. No. 13/832,945, filed on Mar. 15, 2013, now U.S. Pat. No. 9,052,595, the disclosure of which is hereby incorporated by reference in its entirety.

BACKGROUND

Semiconductor devices are fabricated by creating a sequence of patterned and un-patterned layers where the features on patterned layers are spatially related to one another. Thus during fabrication, each patterned layer must be aligned with a previous patterned layer, and as such, an overlay (layer-to-layer alignment) between a first layer and a second layer must be taken into account. As semiconductor processes evolve to provide for smaller critical dimensions and devices reduce in size and increase in complexity including number of layers, an alignment precision between layers becomes increasingly more important to the quality, reliability and yield of the devices. Misalignment of layers can cause performance issues and even potentially cause a device to fail due to, for example, a short caused by a misaligned interconnect layer. An overlay error may be induced by using different exposure tools to expose different layers. It is desired to have improvements in this area.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows may include embodiments in which the first and second features are formed in direct contact, and may also include embodiments in which additional features may be formed between the first and second features, such that the first and second features may not be in direct contact.

Figure 1:
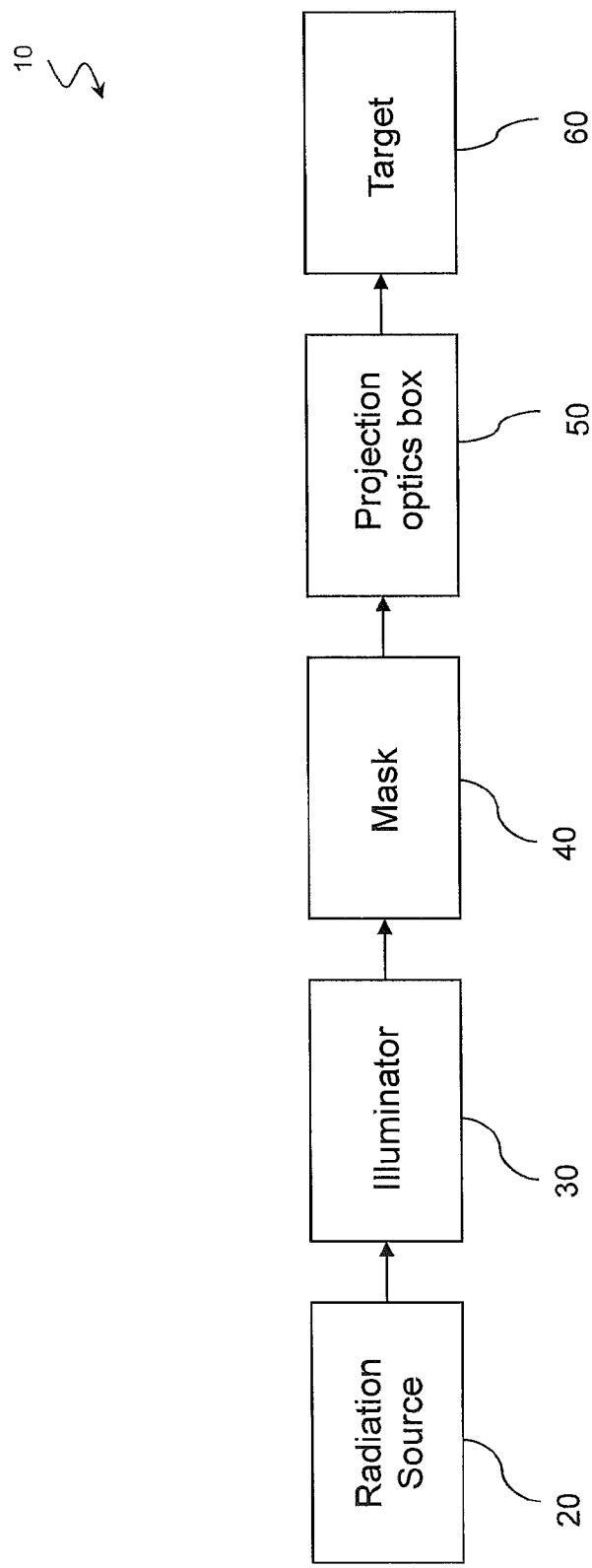
FIG. 1 is a simplified block diagram of a lithography system for implementing one or more embodiments of the present invention.

Referring to FIG. 1, a lithography system 10 includes a radiation source 20, an illuminator 30, a mask 40 (in the present disclosure, the terms of mask, photomask, and reticle are used to refer to the same item), a projection optics box 50 and a target 60 such as a semiconductor wafer on a substrate stage. However, other configurations and inclusion or omission of devices may be possible.

In the present embodiment, the radiation source 20 may be any suitable light source, such as a Krypton Fluoride (KrF) excimer laser with wavelength of 248 nm, an Argon Fluoride (ArF) excimer laser with a wavelength of 193 nm, a fluorine dimer (F2) excimer laser with a wavelength of 157 nm, or other light sources having a longer wavelength. The radiation source 20 may include an optical source selected from the group consisting of ultraviolet (UV) source, deep UV (DUV) source, extreme UV (EUV) source, and X-ray source. The radiation source may alternatively include a particle source selected from the group consisting of electron beam (E-Beam) source, ion beam source, and plasma source.

The illuminator 30 may include refractive optics, such as a single lens or a lens system having multiple lenses (zone plates) and/or reflective optics, such as a single mirror or a mirror system having multiple mirrors in order to direct light from the radiation source 20 onto the mask 40.

The mask 40 can be a transmissive mask or a reflective mask. The mask 40 includes a patterned absorption (opaque) layer. A light beam may be partially or completely blocked when directed on an opaque region. The opaque layer may be patterned to have one or more openings through which a light beam may travel through (for a transmissive mask) or reflect from a reflective region (for a reflective mask). The mask 40 may incorporate other resolution enhancement techniques such as phase shift mask (PSM) and/or optical proximity correction (OPC).

The projection optics box 50 may have refractive optics or reflective optics. The projection optics box 50 directs the patterned radiation towards the target 60 (e.g., a semiconductor wafer).

The target 60 includes a semiconductor wafer with a resist layer, which is sensitive to the radiation. The target 60 may be held by a target substrate stage. The target substrate stage provides control of the target substrate position such that the image of the mask is scanned onto the target substrate in a repetitive fashion (though other lithography methods are possible).

Figure 2:
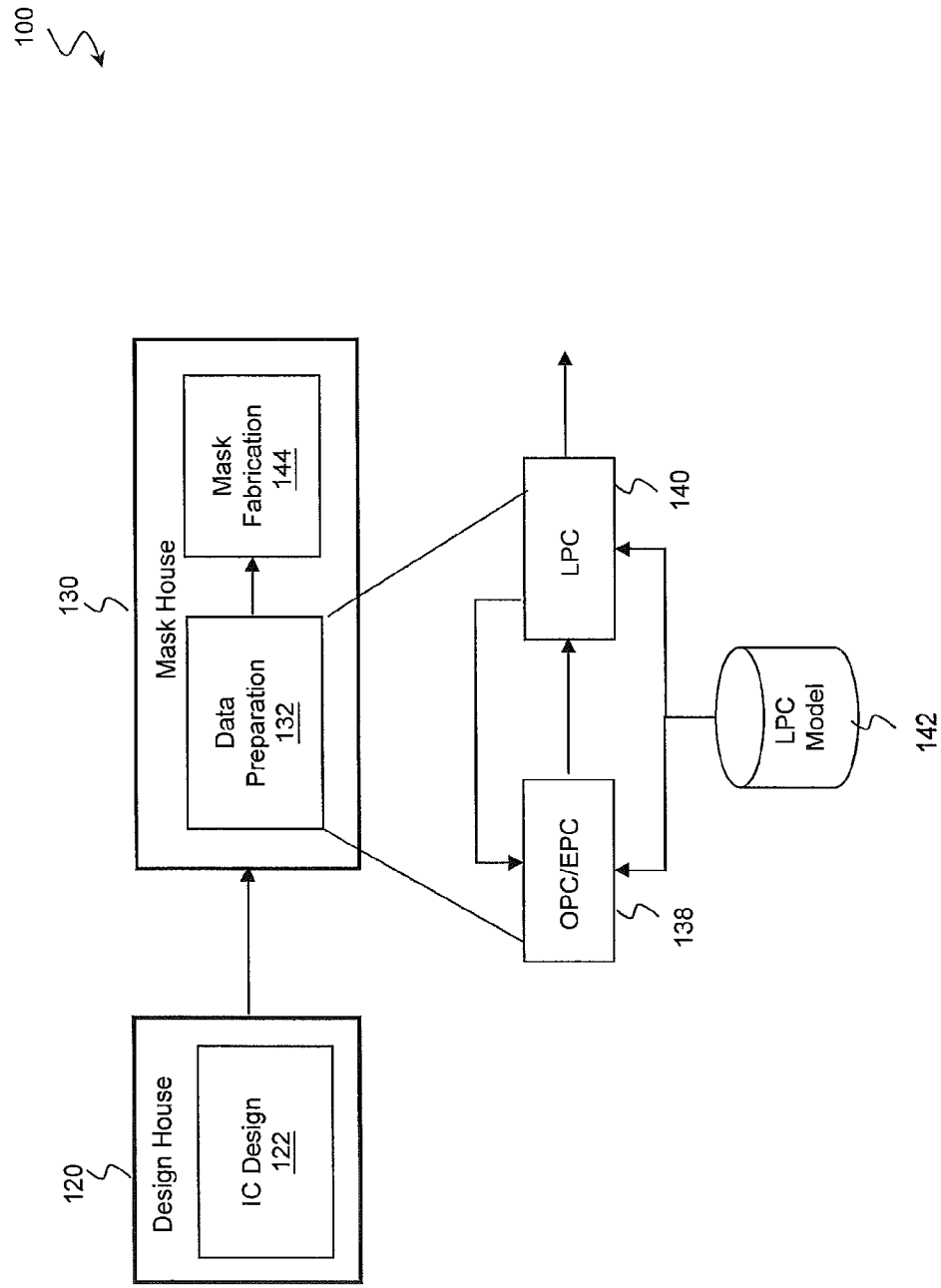
FIG. 2 is a simplified block diagram of a mask fabricating system for implementing one or more embodiments of the present invention.

FIG. 2 is a simplified block diagram of an embodiment of a mask manufacturing system 100. The mask manufacturing system 100 includes a plurality of entities, such as a design house 120 and a mask house 130. The plurality of entities are connected by a communications network, which may be a single network or a variety of different networks, such as an intranet and the Internet, and may include wired and/or wireless communication channels. Each entity may interact with other entities and may provide services to and/or receive services from the other entities.

The design house (or design team) 120 generates an IC design layout 122. The IC design layout 122 includes various geometrical patterns designed for an IC product, based on a specification of the IC product to be manufactured. The design house 120 implements a proper design procedure to form the IC design layout 122. The design procedure may include logic design, physical design, and/or place and route. The IC design layout 122 is presented in one or more data files having information of the geometrical patterns. For example, the IC design layout 122 can be expressed in a GDSII file format (or DFII file format).

The mask house 130 (or mask shop) uses the IC design layout 122 to manufacture one or more masks to be used for fabricating the various layers of the IC product according to the IC design layout 122. The mask house 130 performs mask data preparation 132, where the IC design layout 122 is translated into a form that can be physically written by a mask writer, and mask fabrication 144, where the design layout prepared by the mask data preparation 132 is modified to comply with a particular mask writer and/or mask manufacturer and is then fabricated. In the present embodiment, the mask data preparation 132 and mask fabrication 144 are illustrated as separate elements, however, the mask data preparation 132 and mask fabrication 144 can be collectively referred to as mask data preparation.

The mask data preparation 132 includes an optical proximity correction (OPC) 138, and a lithography process check (LPC) 140. The OPC 138 is a lithography enhancement technique used to compensate for image errors, such as those that can arise from diffraction, interference, or other process effects. OPC 138 may add features, such as scattering bars, serif, and/or hammerheads to the IC design layout 122 according to optical models or rules such that, after a lithography process, a final pattern on a wafer is improved with enhanced resolution and precision.

The LPC 140 simulates processing that will be implemented by the IC manufacturer to fabricate ICs. The LPC 140 simulates this processing based on the IC design layout 122 to create a simulated manufactured device. The simulated manufactured device includes simulated contours of all or a portion of the IC design layout. In the present embodiment, the LPC 140 simulates processing of the modified IC design layout, which has been subjected to the OPC 138. The LPC 140 uses one or more LPC models (or rules) 142. The LPC models (or rules) 142 may be based on actual processing parameters of the IC manufacturer. The processing parameters can include parameters associated with various processes of the IC manufacturing cycle, parameters associated with tools used for manufacturing the IC, and/or other aspects of the manufacturing process.

Figure 3:
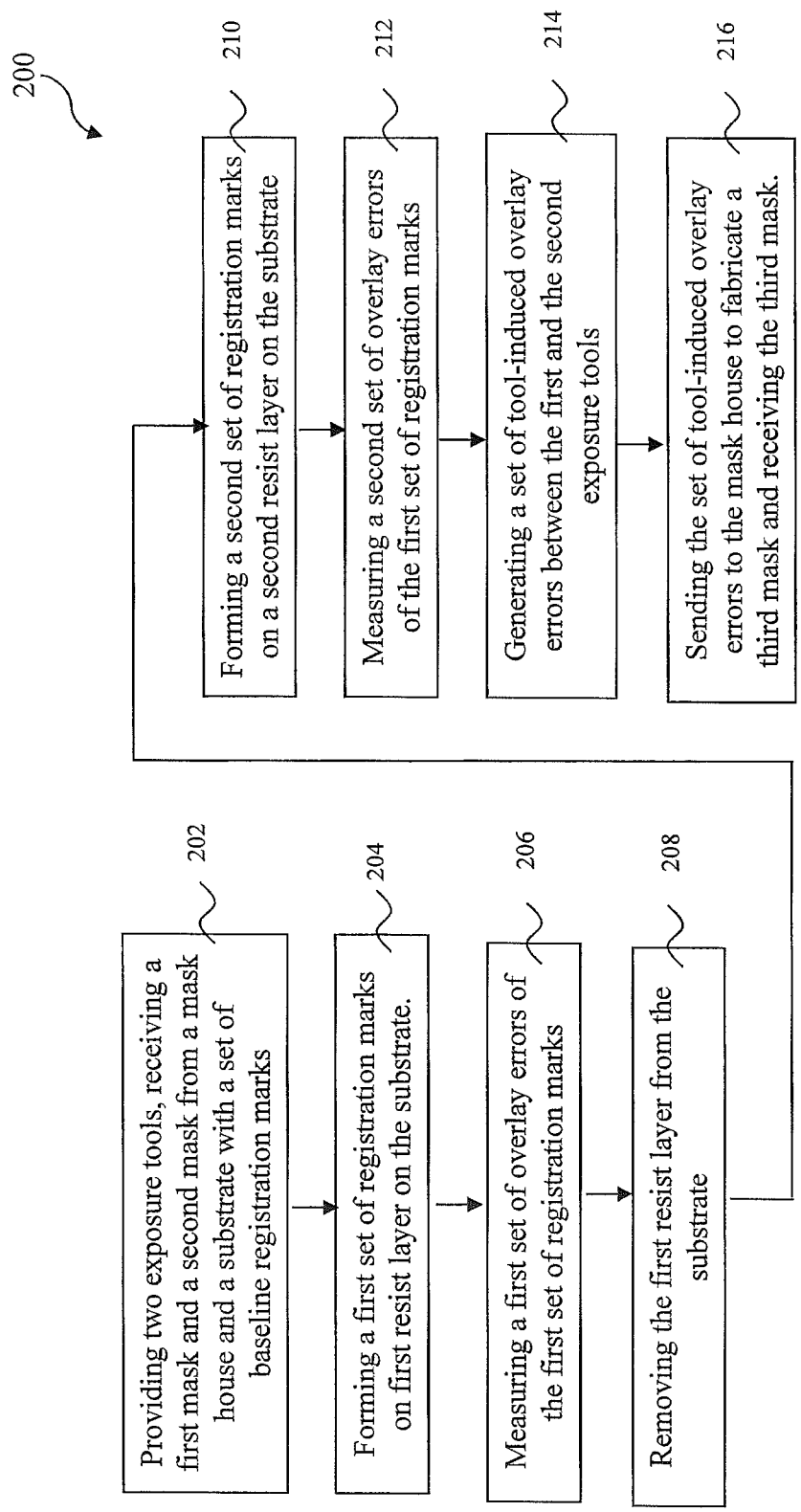
FIG. 3 is a flowchart of a lithography process according to various aspects of the present disclosure.

FIG. 3 is a flowchart of a lithography process 200 performed by the lithography system 10 of FIG. 1 and the mask fabricating system 100 of FIG. 2, according to various embodiments. The lithography process 200 in FIG. 3 is an overview and details associated with each step in the process will be described in association with the subsequent figures in the present disclosure.

The method 200 begins at step 202 by providing two lithographic exposure tools (a first exposure tool and a second exposure tool), receiving a first mask fabricated by a mask writer with a first grid table for exposing a first layer on the first exposure tool and a second mask fabricated by a mask writer with a second grid table for exposing a second layer on the second exposure tool from a mask house and providing a substrate 300 with a set of baseline registration marks 310. The substrate 300 includes a semiconductor substrate having an elementary semiconductor such as crystal silicon, polycrystalline silicon, amorphous silicon and germanium, a compound semiconductor such as silicon carbide and gallium arsenic, an alloy semiconductor such as SiGe, GaAsP, AlInAs, AlGaAs, and GaInP, or a combination thereof. The set of baseline registration marks 310 may be formed by deposition, patterning and etching processes known in the art. The set of baseline registration marks 310 includes various configurations, such as box-in-box, frame-in-frame and cross-in-box. >>>>>>>The method 200 begins at step 202 by receiving a first mask fabricated by a first mask writer with a first grid table for exposing a first layer on a first exposure tool and a second mask fabricated by a second mask writer with a second grid table for exposing a second layer on a second exposure tool from a mask house and receiving a substrate 300 with a set of baseline registration marks 310. The substrate 300 includes a semiconductor substrate having an elementary semiconductor such as crystal silicon, polycrystalline silicon, amorphous silicon and germanium, a compound semiconductor such as silicon carbide and gallium arsenic, an alloy semiconductor such as SiGe, GaAsP, AlInAs, AlGaAs, and GaInP, or a combination thereof. The set of baseline registration marks 310 may be formed by deposition, patterning, and etching processes known in the art. The set of baseline registration marks 310 includes various configurations, such as box-in-box, frame-in-frame, and cross-in-box.

The first exposure tool and the second exposure tool may be equipped with any suitable optical source, such as ultraviolet (UV) source, deep UV (DUV) source, extreme UV (EUV) source, and X-ray source or other optical sources having longer wavelengths. The first exposure tool may have fairly different process capabilities than those of the second exposure tool, such as having different field distortion signature and resolution. The first exposure tool and the second exposure tool may come from two different exposure tool suppliers. The first exposure tool and the second exposure tool may include a high-end exposure tool and a lower-resolution exposure tool. Because of the high cost of a high-end exposure tool, an IC manufacturing usually uses the high-end exposure tool for critical layers and the lower-resolution exposure tool for less critical layers, which results in different layers being exposed on different exposure tools. In the present embodiment, The first exposure tool and the second exposure tool are assigned to expose two different layers.

The first mask and the second mask are received from a mask house, such as the mask house 130. The first mask and the second mask may be of similar or different types, including transmissive masks and reflective masks. The transmissive mask usually includes a transparent substrate and a patterned absorption layer. The reflective mask usually includes a substrate, a reflective multilayer (ML), and a patterned absorption layer. A light beam from an optical source may be partially or almost completely absorbed when directed onto the absorption layer. The absorption layer may be patterned to have one or more openings through which a light beam may travel through the transparent substrate (for a transmissive mask) or reflect from the reflective ML (for a reflective mask). In the present embodiment, the first mask and the second mask may be of a same type or of different types. The first mask is provided by the mask house 130 with the first grid table configured for the first exposure tool. Similarly, the second mask is provided by the mask house 130 with the second grid table configured for the second exposure tool. The first mask and the second mask may be written by a same mask writer or by two different mask writers.

Figure 4B:
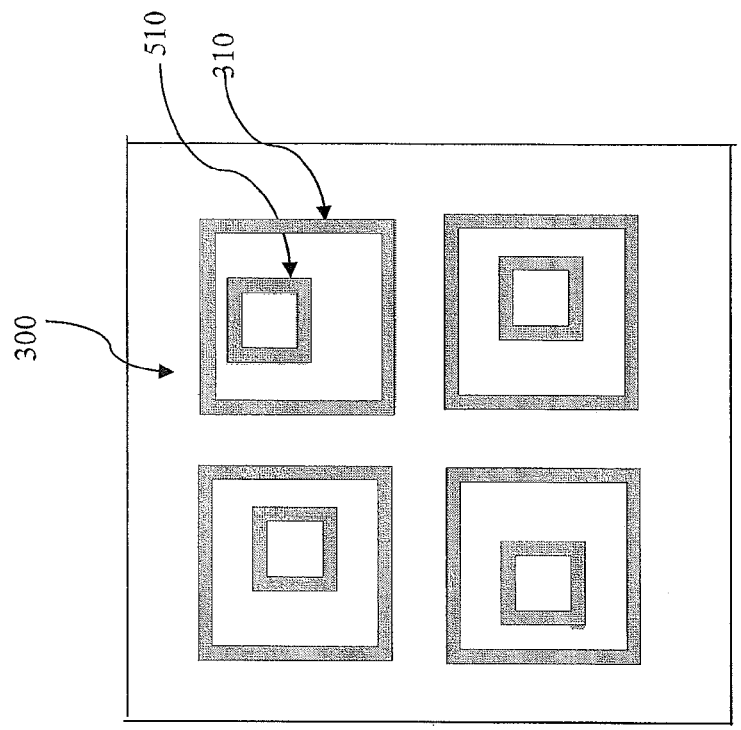
FIGS. 4A and 4B are a top views of images provided in one or more steps of the process of FIG. 3.
Figure 4A:
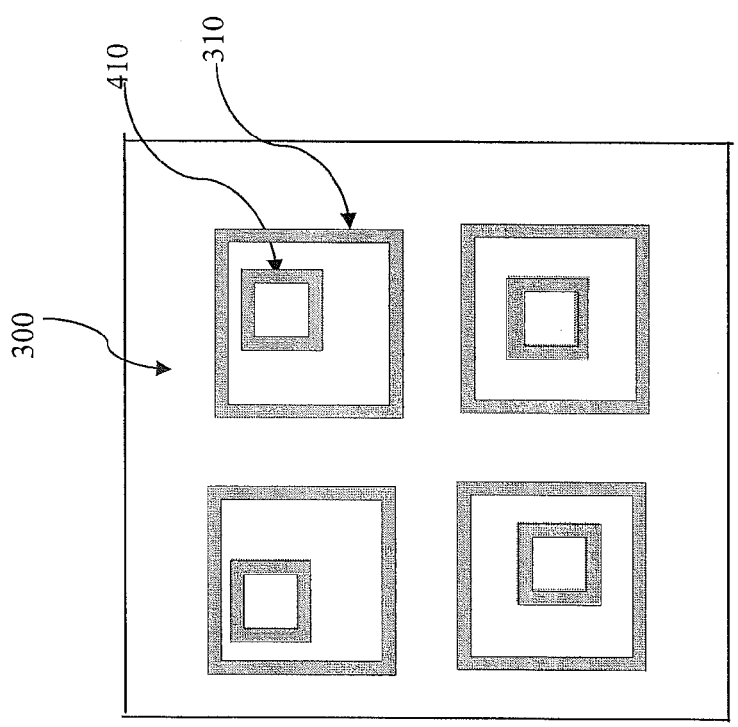

Referring to FIG. 4A, the method 200 proceeds to step 204 by forming a first set of registration marks 410 on a first photo-sensitive layer (e.g., photoresist, or simply "resist") on the substrate 300 by using the first mask and the first exposure tool. The first resist layer is deposited on the substrate 300 by any proper techniques, such as a spin-on technique. The first resist layer receives a patterned light exposure from the first mask by using the first exposure tool. The light causes a chemical change in exposed regions of the first resist layer, which may increase or decrease solubility of the exposed regions. If the exposed regions become more soluble, the first resist is referred to as a positive resist. If the exposed regions become less soluble, the first resist is referred to as a negative resist. Baking processes may be performed before or after resist exposure, such as a post-exposure baking process. A developing process selectively removes the exposed or unexposed regions with a developing solution and creating the first set of registration marks 410 on the substrate 300.

Figure 5:
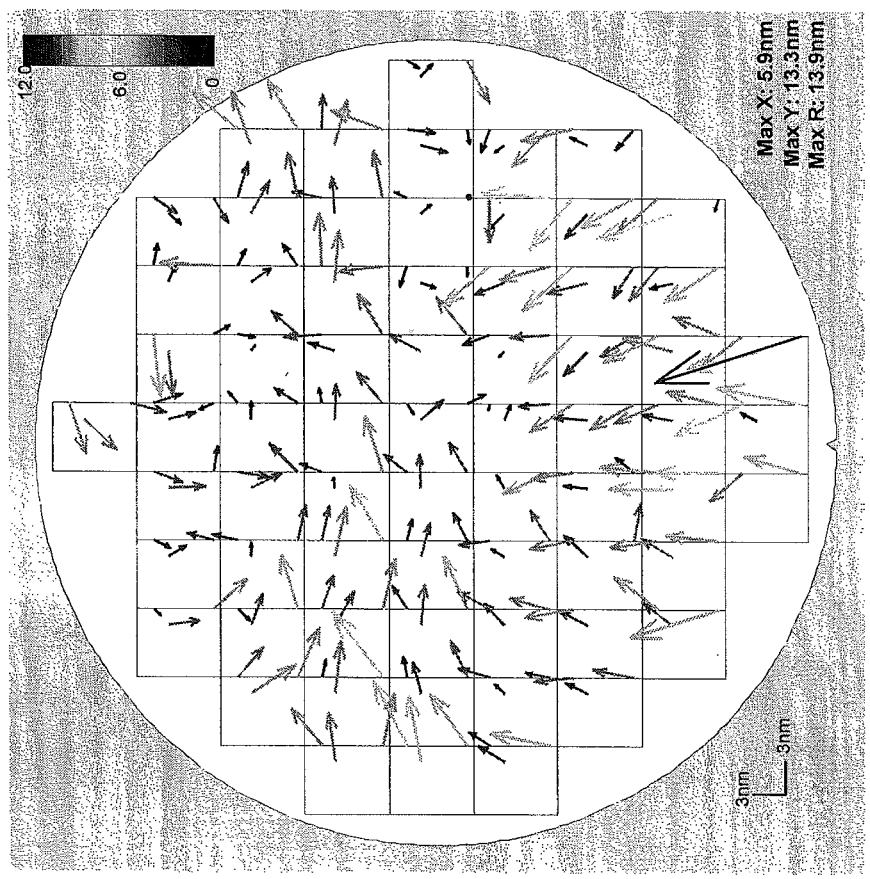
FIG. 5 is an exemplary embodiment of an overlay error map used and/or generated by the lithography process of FIG. 3.

The method 200 proceeds to step 206 by measuring a first set of overlay errors of the first set of registration marks 410 with respect to the set of baseline registration marks 310. The first set of overlay errors is measured by an overlay metrology tool. The overlay metrology tool may include an image-based overlay metrology system or a diffraction-based overlay metrology system. For example, the overlay metrology tool is equipped with a camera operable to scan and generate an overlay image. The overlay image is a digitized image of a pair of registration marks, with one registration mark from the first set of registration marks 410 and the other registration mark from the set of baseline registration marks 310. The overlay image is then processed using various image analysis algorithms to determine an overlay error, i.e., the displacement from the center of the outer registration mark to the center of the inner registration mark. By measuring all pairs of registration marks, the first set of overlay errors is obtained, as shown in FIG. 5.

The method 200 proceeds to step 208 by removing the first resist layer from the substrate 300. The first resist layer can be removed by any proper processes, such as plasma dry etch or a wet etch. Since the first set of registration marks 410 is formed on the first resist layer, the first set of registration marks 410 is removed in the removal of the first resist layer.

Referring to FIG. 4B, the method 200 proceeds to step 210 by forming a second set of registration marks 510 on a second resist layer on the substrate 300 by using the second mask and the second exposure tool. The formation of the second set of registration marks 510 on the second resist layer is similar in many respects to those discussed above in step 204.

The method 200 proceeds to step 212 by measuring a second set of overlay errors of the second set of registration marks 510 with respect to the set of baseline registration marks 310. The second set of overlay errors is measured in a similar way in many respects to those discussed above in step 206.

The method 200 proceeds to step 214 by generating a set of tool-induced overlay errors between the first exposure tool and the second exposure tool. The set of tool-induced overlay errors is generated by applying a predetermined algorithm on the first set of overlay errors and the second sets of overlay errors. For example, the set of tool-induced overlay errors is generated by subtracting the second set of overlay errors from the first set of overlay errors (when used for fabricating the first mask). Alternatively, the set of tool-induced overlay errors is generated by subtracting the first set of overlay errors from the second set of overlay errors (when used for fabricating the second mask). The difference between the two sets of overlay errors represents a possible set of tool-induced overlay errors when two exposure tools are assigned to exposure two layers.

The method 200 proceeds to step 216 by sending the set of tool-induced errors to a mask house for fabricating a third mask and then receiving the third mask. The third mask has a grid table adjusted by using the set of tool-induced errors on one of the two grid tables, the first or the second grid table, depending on the first or the second exposure tool to be used. For example, the set of tool-induced overlay errors is used by the mask house 130 to adjust the second grid table to fabricate the third mask. Then the third mask is received and used by the second exposure tool to expose a layer which is needed to align a layer exposed by the first exposure tool. Alternatively, the adjustment is made on the first grid table to fabricate the third mask in the mask house. Then the third mask is received and used by the first exposure tool to expose a layer which is needed to align with a layer exposed by the second exposure tool.

Based on the above, it can be seen that the present disclosure offers a process to reduce tool-induced overlay error between two exposure tools. The process provides a tool overlay matching with flexibility of mask type being used. The process has demonstrated improvements in flexibility in exposure tool's assignment to a specific layer and enhanced manufacture's capability to take advantages of the most advanced exposure tools where they are needed while using lower resolution exposure tool on less critical layers. The process demonstrates overall cost reduction and lifetime extension of lithography tools.

The present disclosure provides many different embodiments. In one embodiment, the present disclosure provides a lithography method. The method comprises receiving a first mask fabricated by a first mask writer with a first grid table, receiving a second mask fabricated by a second mask writer with a second grid table, and receiving a substrate with a set of baseline registration marks. The method also comprises forming a first set of registration marks on the substrate using the first mask and a first exposure tool, measuring a first set of overlay errors of the first set of registration marks with respect to the set of baseline registration marks, removing the first set of registration marks from the substrate, forming a second set of registration marks on the substrate using the second mask and a second exposure tool, measuring a second set of overlay errors of the second set of registration marks with respect to the set of baseline registration marks, generating a set of tool-induced overlay errors from the first set of overlay errors and the second set of overlay errors, sending the set of tool-induced overlay error to a mask maker to fabricate a third mask. In one example, the set of tool-induced overlay errors is generated by subtracting the second set of overlay errors from the first set of overlay errors and the third mask is fabricated by the first mask writer with an adjusted first grid table obtained by subtracting the set of tool-induced overlay errors from the first grid table, wherein the third mask is used on the first exposure tool to expose a layer which is needed to align a layer exposed by the second exposure tool. In another example, the set of tool-induced overlay errors is generated by subtracting the first set of overlay errors from the second set of overlay errors and the third mask is fabricated by the second mask writer with an adjusted second grid table obtained by subtracting the set of tool-induced overlay errors from the second grid table, wherein the third mask is used on the second exposure tool to expose a layer which is needed to align a layer exposed by the first exposure tool.

In another embodiment, the present disclosure provides a method for fabricating a device using a first exposure tool and a second exposure tool. The method comprises receiving a first mask fabricated by a first mask writer with a first grid table for exposing a first layer on the first exposure tool, receiving a second mask fabricated by a second mask writer with a second grid table for exposing a second layer on the second exposure tool, and receiving a substrate with a set of baseline registration marks. The method also includes forming a first resist layer on the substrate, forming a first set of registration marks on the first resist layer using the first mask and the first exposure tool, measuring a first set of overlay errors of the first set of registration marks with respect to the set of baseline registration marks, after measuring the first set of overlay errors, removing the first resist layer and forming a second resist layer on the substrate, forming a second set of registration marks on the second resist layer using the second mask and the second exposure tool, measuring a second set of overlay errors of the second set of registration marks with respect to the set of baseline registration marks, generating a set of tool-induced overlay errors from the first set of overlay errors and the second set of overlay errors, and sending the set of tool-induced overlay error to a mask maker to fabricate a third mask. The method further comprises fabricating the device by one of the following four options, namely using the third mask on the first exposure tool and the second mask on the second exposure tool, or using the third mask on the first exposure tool and a new second mask, which is fabricated by the second mask writer with the second grid table, on the second exposure tool, or using the first mask on the first exposure tool and the third mask on the second exposure tool, or using a new first mask, which is fabricated by the first mask writer with the first grid table, on the first exposure tool and the third mask on the second exposure tool. In one example, the third mask is fabricated by the first mask writer with an adjusted first grid table obtained by subtracting the set of tool-induced overlay errors from the first grid table if the third mask is used on the first exposure tool, wherein the set of tool-induced overlay errors is generated by subtracting the second set of overlay errors from the first set of overlay errors. In another example, the third mask is fabricated by the second mask writer with an adjusted second grid table obtained by subtracting the set of tool-induced overlay errors from the second grid table if the third mask is used on the second exposure tool, wherein the set of tool-induced overlay errors is generated by subtracting the first set of overlay errors from the second set of overlay errors.

In still another embodiment, the present disclosure provides a method that can be used, for example, by a mask house. The method comprises receiving a first set of overlay errors from a first mask used on a first exposure tool, receiving a second set of overlay errors from a second mask used on a second exposure tool, determining a set of tool-induced overlay errors from the first set of overlay errors and the second set of overlay errors, and preparing a third mask based on the set of tool-induced overlay errors. In one example, the first mask is fabricated by using a first grid table and the third mask is fabricated by using an adjusted first grid table obtained by subtracting the set of tool-induced overlay errors from the first grid table, wherein the set of tool-induced overlay errors is obtained by subtracting the second set of overlay errors from the first set of overlay errors, if the third mask is to be used on the first exposure tool for patterning a first layer, which is to be aligned to a second layer exposed on the second exposure tool. In another example, the second mask is fabricated by using a second grid table and the third mask is fabricated by using an adjusted second grid table obtained by subtracting the set of tool-induced overlay errors from the second grid table, wherein the set of tool-induced overlay errors is obtained by subtracting the first set of overlay errors from the second set of overlay errors, if the third mask is to be used for patterning a second layer, which is to be aligned to a first layer exposed on the first exposure tool, on the second exposure tool.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   providing a substrate having a set of baseline registration marks;
   forming a first set of registration marks, defined by a first mask, on the substrate;
   determining a first set of overlay errors of the first set of registration marks with respect to the set of baseline registration marks;
   forming a second set of registration marks, defined by a second mask, on the substrate;
   determining a second set of overlay errors of the second set of registration marks with respect to the set of baseline registration marks;
   generating a set of tool-induced overlay errors from the first set of overlay errors and the second set of overlay errors; and
   fabricating a device by using a third mask fabricated using the set of tool-induced overlay errors.

2. The method of claim 1, wherein the first mask is fabricated by a first mask writer with a first grid table, and wherein the second mask is fabricated by a second mask writer with a second grid table.

3. The method of claim 1, further comprising prior to forming the second set of registration marks on the substrate, removing the first set of registration marks from the substrate.

4. The method of claim 2, wherein the first mask writer and the second mask writer are a same mask writer.

5. The method of claim 1, wherein the forming the first set of registration marks further includes forming the first set of registration marks using the first mask and a first exposure tool, and wherein the forming the second set of registration marks further includes forming the second set of registration marks using the second mask and a second exposure tool.

6. The method of claim 1, wherein the first set of registration marks is formed on a first resist layer on the substrate.

7. The method of claim 6, further comprising:
   after determining the first set of overlay errors, removing the first resist layer; and
   forming a second resist layer on the substrate.

8. The method of claim 7, wherein the second set of registration marks is formed on the second resist layer.

9. The method of claim 2, wherein the set of tool-induced overlay errors is generated by subtracting the second set of overlay errors from the first set of overlay errors and the third mask is fabricated by the first mask writer with an adjusted first grid table obtained by subtracting the set of tool-induced overlay errors from the first grid table.

10. The method of claim 9, wherein the third mask is used on the first exposure tool to expose a layer which is needed to align a layer exposed by the second exposure tool.

11. The method of claim 2, wherein the set of tool-induced overlay errors is generated by subtracting the first set of overlay errors from the second set of overlay errors and the third mask is fabricated by the second mask writer with an adjusted second grid table obtained by subtracting the set of tool-induced overlay errors from the second grid table.

12. The method of claim 11, wherein the third mask is used on the second exposure tool to expose a layer which is needed to align a layer exposed by the first exposure tool.

13. A method comprising:
providing a first mask fabricated by a first mask writer with a first grid table for exposing a first layer on the first exposure tool;
providing a second mask fabricated by a second mask writer with a second grid table for exposing a second layer on the second exposure tool;
receiving a substrate with a set of baseline registration marks;
forming a first resist layer on the substrate;
forming a first set of registration marks on the first resist layer using the first mask and the first exposure tool;
measuring a first set of overlay errors of the first set of registration marks with respect to the set of baseline registration marks;
after measuring the first set of overlay errors, removing the first resist layer and forming a second resist layer on the substrate;
forming a second set of registration marks on the second resist layer using the second mask and the second exposure tool;
measuring a second set of overlay errors of the second set of registration marks with respect to the set of baseline registration marks;
generating a set of tool-induced overlay errors from the first set of overlay errors and the second set of overlay errors; and
fabricating a device using a third mask, the third mask fabricated using the set of tool-induced overlay errors.

14. The method of claim 13, wherein the fabricating the device further includes fabricating the device using the third mask on the first exposure tool and the second mask on the second exposure tool.

15. The method of claim 13, wherein the fabricating the device further includes fabricating the device using the third mask on the first exposure tool and a new second mask, which is fabricated by the second mask writer with the second grid table, on the second exposure tool.

16. The method of claim 13, wherein the fabricating the device further includes fabricating the device using the first mask on the first exposure tool and the third mask on the second exposure tool.

17. The method of claim 13, wherein the fabricating the device further includes fabricating the device using a new first mask, which is fabricated by the first mask writer with the first grid table, on the first exposure tool and the third mask on the second exposure tool.

18. A method comprising:
receiving a first set of overlay errors from a first mask used on a first exposure tool, the first set of overlay errors based on a first set of registration marks measured with respect to a set of baseline registration marks;
receiving a second set of overlay errors from a second mask used on a second exposure tool, the second set of overlay errors based on a second set of registration marks measured with respect to the set of baseline registration marks;
determining a set of tool-induced overlay errors from the first set of overlay errors and the second set of overlay errors;
fabricating a third mask based on the set of tool-induced overlay errors; and
fabricating a device by using the third mask.

19. The method of claim 18, wherein the first mask is fabricated by using a first grid table and the third mask is fabricated by using an adjusted first grid table obtained by subtracting the set of tool-induced overlay errors from the first grid table, wherein the set of tool-induced overlay errors is obtained by subtracting the second set of overlay errors from the first set of overlay errors, if the third mask is to be used on the first exposure tool for patterning a first layer, which is to be aligned to a second layer exposed on the second exposure tool.

20. The method of claim 18, wherein the second mask is fabricated by using a second grid table and the third mask is fabricated by using an adjusted second grid table obtained by subtracting the set of tool-induced overlay errors from the second grid table, wherein the set of tool-induced overlay errors is obtained by subtracting the first set of overlay errors from the second set of overlay errors, if the third mask is to be used for patterning a second layer, which is to be aligned to a first layer exposed on the first exposure tool, on the second exposure tool.

* * * * *